United States Patent
Bae et al.

(10) Patent No.: US 7,251,140 B2
(45) Date of Patent: Jul. 31, 2007

(54) DISPLAY APPARATUS HAVING HEAT DISSIPATING STRUCTURE FOR DRIVER INTEGRATED CIRCUIT

(75) Inventors: Sung-Won Bae, Suwon-si (KR); Joong-Ha Ahn, Suwon-si (KR); Hyouk Kim, Suwon-si (KR)

(73) Assignee: Samsung SDI Co., Ltd, Suwon-si (KR)

( * ) Notice: Subject to any disclaimer, the term of this patent is extended or adjusted under 35 U.S.C. 154(b) by 146 days.

(21) Appl. No.: 10/966,241

(22) Filed: Oct. 15, 2004

(65) Prior Publication Data

US 2005/0083646 A1   Apr. 21, 2005

(30) Foreign Application Priority Data

Oct. 17, 2003   (KR) ...................... 10-2003-0072475

(51) Int. Cl.
*H05K 7/20* (2006.01)
*G02F 1/1333* (2006.01)

(52) U.S. Cl. ............... 361/719; 361/704; 361/707; 361/708; 349/58

(58) Field of Classification Search ............... None
See application file for complete search history.

(56) References Cited

U.S. PATENT DOCUMENTS

| | | | | |
|---|---|---|---|---|
| 5,736,768 A | * | 4/1998 | Zavracky et al. ........... | 257/347 |
| 5,971,566 A | * | 10/1999 | Tani et al. .................. | 362/294 |
| 6,275,220 B1 | * | 8/2001 | Nitta .......................... | 345/204 |
| 6,288,489 B1 | * | 9/2001 | Isohata et al. ............... | 313/582 |
| 6,317,175 B1 | * | 11/2001 | Salerno et al. ............... | 349/45 |
| 6,366,264 B1 | * | 4/2002 | Kurumada ................... | 345/60 |

(Continued)

FOREIGN PATENT DOCUMENTS

CN   1397999 A   2/2003

(Continued)

OTHER PUBLICATIONS

Patent Abstracts of Japan, Publication No. 05-313184, dated Nov. 26, 1993, in the name of Masanori Takahashi et al.

(Continued)

*Primary Examiner*—Boris Chérvinsky
(74) *Attorney, Agent, or Firm*—Christie, Parker & Hale, LLP

(57) ABSTRACT

A display apparatus dissipates heat efficiently from a tape carrier package driver integrated circuit providing an address voltage to a display panel. The display apparatus includes a display panel, a chassis base, a driving circuit, an flexible printed circuit electrically connecting electrodes of the display panel to the driving circuit, and a driver integrated circuit connected through the flexible printed circuit to the display panel, the driver integrated circuit providing a voltage selectively to the electrode of the display panel in accordance with signals controlled by the driving circuit. A thermally conductive medium in liquid-phase or gel-phase is placed between the driver integrated circuit and the chassis base. A pressing plate is placed on the outside of the driver integrated circuit opposite to the chassis base, the pressing plate pressing the driver integrated circuit toward the chassis base for good contact and heat dissipation. A thermally conductive medium is placed between the pressing plate and the driver integrated circuit.

10 Claims, 4 Drawing Sheets

U.S. PATENT DOCUMENTS

| | | | |
|---|---|---|---|
| 6,522,543 B2* | 2/2003 | Kurihara et al. | 361/704 |
| 6,597,113 B1* | 7/2003 | Nitta | 313/581 |
| 6,677,664 B2* | 1/2004 | Inoue et al. | 257/668 |
| 6,703,702 B2* | 3/2004 | Inoue et al. | 257/684 |
| 6,761,813 B2* | 7/2004 | Xu | 205/114 |
| 6,774,872 B1* | 8/2004 | Kawada et al. | 345/60 |
| 6,794,026 B2 | 9/2004 | Ebihara et al. | |
| 6,992,895 B2* | 1/2006 | Lindberg | 361/719 |
| 2003/0058230 A1* | 3/2003 | Ide | 345/204 |
| 2004/0095727 A1* | 5/2004 | Houle | 361/704 |
| 2005/0088093 A1* | 4/2005 | Kim et al. | 313/582 |

FOREIGN PATENT DOCUMENTS

| | | | |
|---|---|---|---|
| CN | 1402319 A | | 3/2003 |
| CN | 1420557 A | | 5/2003 |
| EP | 1 282 169 A2 | | 2/2003 |
| JP | 5-313184 | | 11/1993 |
| JP | 6-342165 | | 12/1994 |
| JP | 10-260641 | | 9/1998 |
| JP | 10333173 A | * | 12/1998 |
| JP | 2000-42642 | | 2/2000 |
| JP | 2000-242189 | | 9/2000 |
| JP | 2001-170721 | | 6/2001 |
| JP | 2001-326879 | | 11/2001 |
| JP | 2001-352022 | | 12/2001 |
| JP | 2002-111261 | | 4/2002 |

OTHER PUBLICATIONS

Patent Abstracts of Japan, Publication No. 06-342165, dated Dec. 13, 1994, in the name of Kenji Mizuno et al.

Patent Abstracts of Japan, Publication No. 10-260641, dated Sep. 29, 1998, in the name of Hideto Nitta.

Patent Abstracts of Japan, Publication No. 2000-042642, dated Feb. 15, 2000, in the name of Hideyuki Miyahara.

Patent Abstracts of Japan, Publication No. 2000-242189, dated Sep. 8, 2000, in the name of Shutaro Tsuchiya et al.

Patent Abstracts of Japan, Publication No. 2001-170721, dated Jun. 26, 2001, in the name of Hiroyuki Komatsu et al.

Patent Abstracts of Japan, Publication No. 2001-326879, dated Nov. 22, 2001, in the name of Osamu Hirohashi.

Patent Abstracts of Japan, Publication No. 2001-352022, dated Dec. 21, 2001, in the name of Koichi Inoue et al.

Patent Abstracts of Japan, Publication No. 2002-111261, dated Apr. 12, 2002, in the name of Mikio Kurihara et al.

* cited by examiner

DISPLAY APPARATUS HAVING HEAT DISSIPATING STRUCTURE FOR DRIVER INTEGRATED CIRCUIT

CROSS REFERENCE TO RELATED APPLICATION

This application claims priority to and the benefit of Korean Patent Application 10-2003-0072475 filed on Oct. 17, 2003 in the Korean Intellectual Property Office, the entire content of which is incorporated herein by reference.

BACKGROUND OF THE INVENTION (a) Field of the Invention

The present invention relates to a display apparatus and, in particular, to a display apparatus that can dissipate heat efficiently from a tape carrier package (TCP) driver integrated circuit (IC) providing an address voltage to a display panel.

(b) Description of the Related Art

One common type of display apparatus is a plasma display apparatus. It is well known that a plasma display apparatus uses plasma generated by gas discharge to produce an image on a plasma display panel (PDP). In the plasma display apparatus, electrodes printed on the PDP are conventionally connected electrically to a driving circuit by a flexible printed circuit (FPC). The FPC has an IC for providing an address voltage to selectively form a wall voltage in each pixel in accordance with signals controlled by the driving circuit.

Exemplary structures using the FPC and the IC to provide the voltage are a chip on board (COB) in which the IC is installed on a printed circuit board (PCB), and a chip on film (COF) in which the IC is installed on a film composing the FPC. Another exemplary structure used to provide voltage is the TCP which is small and has a low manufacturing cost.

However, a COF, COB, or TCP installed on the chassis base produces electromagnetic interference (EMI) as well as a large amount of heat. This is partially due to a gas discharge occurring at least 8 times in 1/60 second (1 TV field) which generates more than 256 gradations in the PDP. Therefore, a reinforcing plate is installed in the COB or COF to reinforce the structure of the chassis base and to fix the COB or COF onto the chassis base. The reinforcing plate also serves to efficiently dissipate heat generated in the IC.

In prior devices, the heat generated in the TCP driver IC has been dissipated by attaching a solid heat-dissipating sheet, such as a heat sink, to the TCP. Compared to the size of the IC, however, the heat sink was excessively large due to its low heat dissipation efficiency and its inability at smaller sizes to cope with the amount of the heat generated by the IC. Heat generation then needs to be reduced to prevent a malfunction or breakdown of the TCP driver IC. However, this results in the adoption of an inferior algorithm for picture quality and may cause an overall degradation in the picture quality.

SUMMARY OF THE INVENTION

In accordance with the present invention, a display apparatus is provided in which heat dissipation from a driver IC is enhanced by means of an improved structure for heat dissipation, and thereby includes a smaller, more inexpensive driver IC that improves reliability of the driver IC. Specifically, the heat dissipation means may be used in connection with a plasma display apparatus.

A display apparatus is provided which includes a chassis base, a display panel adjacent to a first side to the chassis base, a driving circuit attached on a second side, the second side opposite the first side of the chassis base where the display panel is attached, a flexible printed circuit (FPC) electrically connecting electrodes of the display panel to the driving circuit, and a driver integrated circuit (IC) connected by the FPC to the display panel, the driver IC selectively providing a voltage to the electrode of the display panel in accordance with signals controlled by the driving circuit.

A thermally conductive medium in, for instance, liquid-phase or gel-phase is placed between the driver IC and the chassis base. Adjacent to the driver IC (opposite to the chassis base) is a pressing plate that presses the driver IC toward the chassis base for good contact and heat dissipation. A thermally conductive medium is placed between the pressing plate and the driver IC.

The driver IC is adapted to fit in a tape carrier package (TCP) and is connected to the FPC.

A high thermal conduction member which may have in one embodiment, a smooth surface is attached to a region in the chassis base facing the driver IC. A thermally conductive medium in liquid-phase or gel-phase may be placed between the driver IC and the high thermal conduction member. Material for the high thermal conduction member may be selected from a group consisting of aluminum, steel, and copper.

The pressing plate may be formed into a single body having two planes: a first plane, facing the driver IC, may be placed parallel to the chassis base; and a second plane may extend from the outer edge of the first plane to the outer edge of the plasma display panel. The pressing plate is made of a material selected from a group consisting of aluminum, steel, and copper, and is fixed to the chassis base by connecting members.

A material such as silicone oil, thermal grease or a phase change material (PCM) may be used for the thermally conductive medium in liquid-phase placed between the driver IC and the chassis base. The thermally conductive medium placed between the pressing plate and the driver IC can be in liquid-phase or gel-phase, or in solid-phase like a silicone sheet.

DETAILED DESCRIPTION

Figure 1:
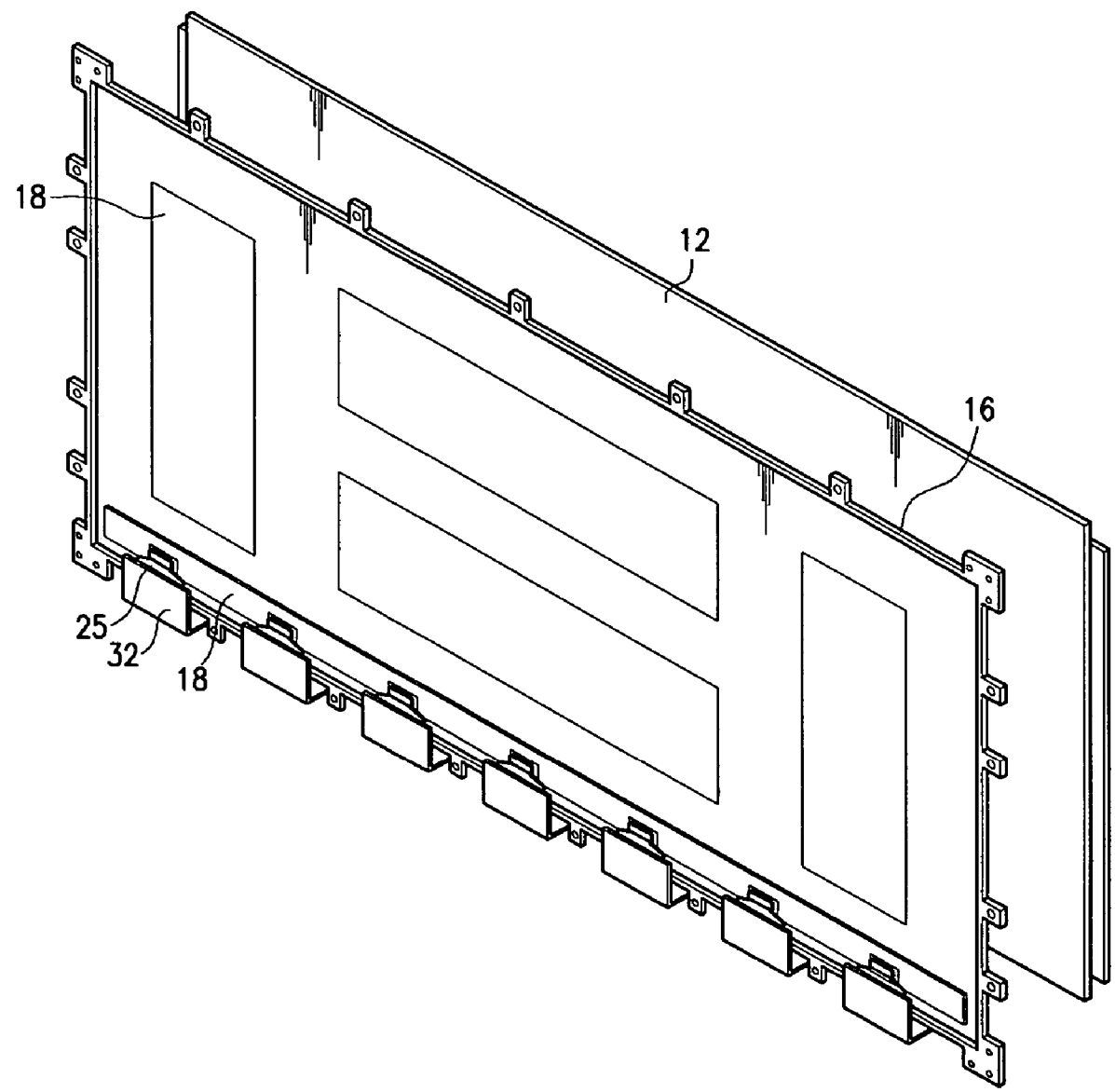
FIG. 1 is a perspective view of a plasma display apparatus having a heat dissipating structure for a TCP driver IC according to an embodiment of the present invention.

As shown in the drawings, a plasma display apparatus in accordance with an embodiment of the present invention includes a PDP 12 and a chassis base 16. The PDP 12 is attached to one side of the chassis base 16 by adhesive means (not shown) such as double-faced tape, and a driving circuit 18 for driving the PDP 12 is attached on the other side of the chassis base 16. The chassis base 16 is placed adjacent and parallel to the PDP 12. The chassis base 16 and the PDP 12 may be situated such that a thermal conduction medium may be positioned therebetween. A front cover (not shown) is placed over the PDP 12, and a back cover (not shown) is placed over the chassis base 16. All of the components are assembled into a plasma display apparatus set.

Figure 2:
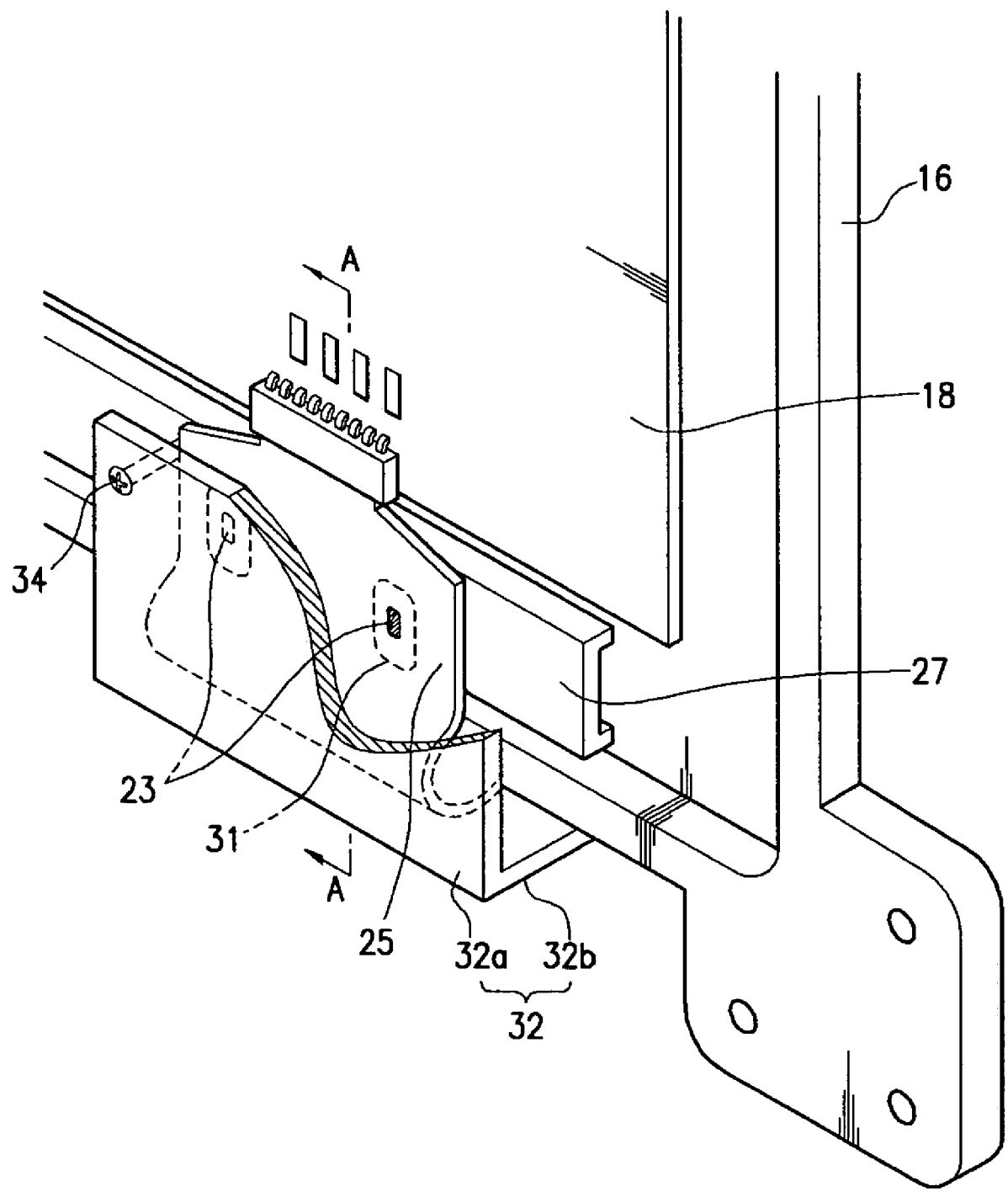
FIG. 2 is a perspective view of a detail of the heat dissipating structure of the TCP driver IC according to the embodiment of the present invention.
Figure 3:
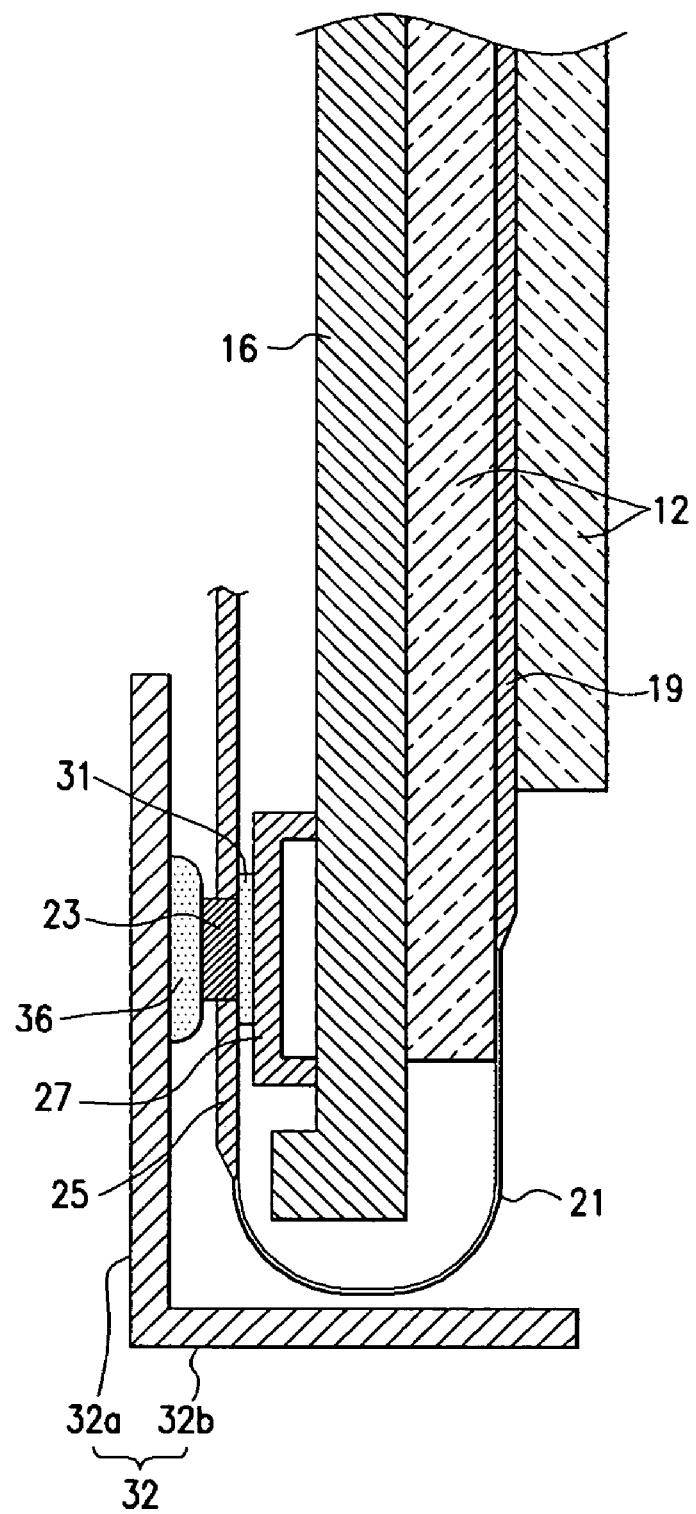
FIG. 3 is a partial side cross-sectional view taken along section line A-A of FIG. 2.

As shown in FIG. 3, electrodes 19 extending from the edge of the PDP 12 are connected electrically through an FPC 21 to the driving circuit 18 to receive signals required for driving. Therefore, one or more driver ICs 23 are installed between the PDP 12 and the driving circuit 18, and serves to selectively provide a voltage to the electrodes of the PDP 12 in accordance with the signals controlled by the driving circuit 18. In the embodiment shown in FIG. 2 and FIG. 3, the driver ICs 23 are adapted to fit the TCP 25 and connect to both the driving circuit 18 and the FPC 21.

A high thermal conduction member 27 is attached to the chassis base 16 at a place where the chassis base faces the driver IC 23. The high thermal conduction member 27 may be made of metal, and particularly, aluminum, copper, or steel. The surface of the high thermal conduction member may be smooth. Additionally, the high thermal conduction member 27 is installed to be aligned with the driver IC 23 packed in the TCP 25. In an alternate embodiment, the high thermal conduction member 27 may be bar-shaped and fixed to the chassis base 16.

In one exemplary embodiment, a thermally conductive medium 31 in liquid- or gel-phase is placed between the driver IC 23 and the high thermal conduction member 27. The thermally conductive medium 31 may be in liquid- or gel-state at least in the operating temperature of the PDP 12, and the thermal conductivity thereof is, in one exemplary embodiment, greater than 0.1 W/mK. Silicone oil, thermal grease, a phase change material (PCM) or a similar material may be used as the thermally conductive medium 31 in liquid- or gel-phase.

Figure 4:
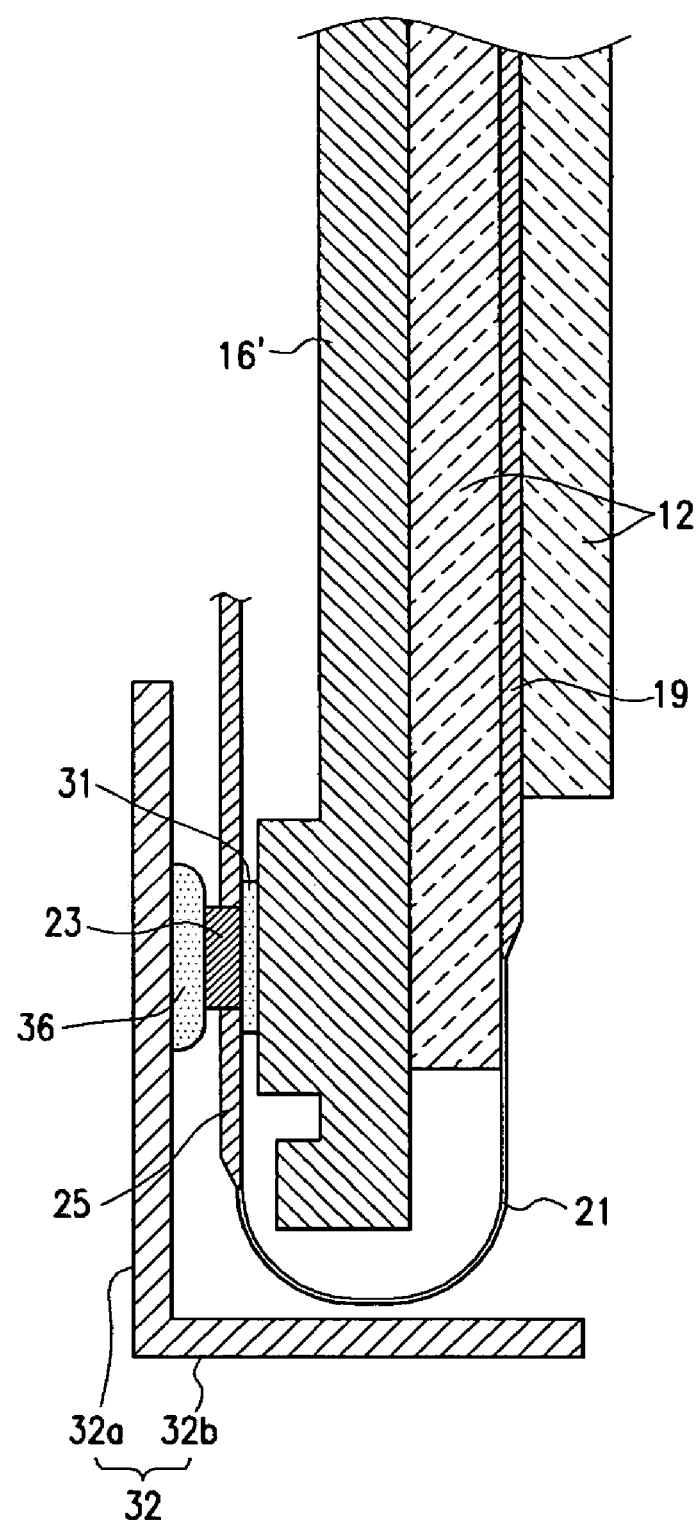
FIG. 4 is a partial side cross-sectional view of a plasma display apparatus according to an alternate embodiment of the present invention.

As described above, the high thermal conduction member 27 is attached to the chassis base 16, facing the driver IC 23, and the thermally conductive medium 31 in liquid- or gel-phase is placed between the driver IC 23 and the high thermal conduction member 27. Referring to FIG. 4, in an alternate embodiment of the present invention, the high thermal conduction member 27 is not used and the driver ICs 23 are in contact with the chassis base 16' through the thermally conductive medium 31 in liquid- or gel-phase placed therebetween.

A pressing plate 32 is positioned adjacent to the driver IC 23, and more specifically, adjacent to the TCP 25 to press the driver IC 23 toward the chassis base 16. The pressing plate 32 may be formed as a single body having a first plane 32a facing the driver IC 23 and placed substantially parallel to the chassis base 16, and a second plane 32b covering the FPC 21 and extending from the outer edge of the first plane 32a to the outer edge of the PDP 12. The pressing plate 32 may be made of metal, for example aluminum, copper, or steel, and may be fixed to the high thermal conduction member 27 by a separate connecting member 34.

A thermally conductive medium 36 is also be placed between the pressing plate 32 and the driver IC 23 facing the pressing plate 32. The thermally conductive medium 36 may be in liquid- or gel-phase, or in solid-phase like a silicone sheet, of which thermal conductivity in one exemplary embodiment is greater than 0.6 W/mK and of which thickness is less than 0.8 mm.

Experimental measurements were carried out to confirm the effect of the heat dissipating structure for the TCP driver IC on the temperature of a 42 inch PDP module having a TCP as described herein. For the purpose of comparison, the temperatures were measured for other heat dissipating structures. As a thermally conductive medium, Comparative Example 1 used a heat dissipating pad between the TCP driver IC and the chassis base instead of a liquid- or gel-type. Comparative Example 2 used no pressing plate while using a liquid- or gel-type thermally conductive medium. Comparative Example 3 was the same as Comparative Example 1 except for a difference in the thickness of the heat dissipating pad. An input voltage to the PDP module was 220 volts, and a reference temperature was the ambient temperature of 25° C. Temperatures were measured at the driver IC, the pressing plate, and the chassis base.

Below, Table 1 shows the components used in each experiment while Table 2 shows the temperatures of the driver ICs, pressing plate and chassis base during the experiment of an embodiment of the present invention as well as the comparative examples.

TABLE 1

| | Component 1 | Component 2 | Component 3 | Component 4 | Component 5 |
|---|---|---|---|---|---|
| Embodiment | Chassis base | Thermal grease | TCP | 0.5 mm heat dissipating pad | Aluminum plate |
| Comparative Example 1 | Chassis base | 0.2 mm heat dissipating pad | TCP | 1.0 mm heat dissipating pad | Aluminum plate |
| Comparative Example 2 | Chassis base | Thermal grease | TCP | — | — |
| Comparative Example 3 | Chassis base | 0.5 mm heat dissipating pad | TCP | 0.5 mm heat dissipating pad | Aluminum plate |

TABLE 2

| | Driver IC | Pressing plate | Chassis base |
|---|---|---|---|
| Embodiment | 83.2° C. | 70.0° C. | 79.0° C. |
| Comparative Example 1 | 122.9° C. | 74.6° C. | 41.7° C. |
| Comparative Example 2 | 97.2° C. | — | 62.4° C. |
| Comparative Example 3 | 94.5 | 81.0 | 75.0 |

Among the experimental examples, as seen in Table 2, the embodiment of the present invention shows the lowest temperature for the driver IC and the highest temperature for the chassis base compared to Comparative Examples 1 through 3. This implies that the heat from the driver IC is efficiently transferred through the thermally conductive medium in liquid- or gel-phase (thermal grease) to the chassis base which serves as a heat sink.

In addition, the efficiency in heat dissipation from the driver IC deteriorates in Comparative Example 2 where the thermal grease is used. This is due to the absence of a pressing plate which ordinarily serves to push the driver IC to the chassis base for firm contact therebetween.

According to an embodiment of the present invention, a plasma display apparatus has a heat dissipating structure for the driver IC that efficiently dissipates heat from the driver IC through the chassis base by means of the thermally conductive medium in liquid- or gel-phase placed therebetween.

In addition, a pressing plate to push the TCP driver IC to the chassis base for firm contact not only fixes the TCP securely, but also further increases the efficiency in heat dissipation. Furthermore, the pressing plate may protect the FPC connecting the electrodes extending from the edge of the PDP by extending the outer edge of the electrodes to the outer edge of the PDP.

Although exemplary embodiments of the present invention have been described in detail hereinabove, it should be understood that many variations and/or modifications of the basic inventive concept taught herein will still fall within the spirit and scope of the present invention, as defined in the appended claims.

What is claimed is:

1. A display apparatus comprising:
    a chassis base;
    a display panel positioned adjacent to a first side of the chassis base;
    a driving circuit attached on a second side of the chassis base, the second side opposite the first side of the chassis base where the display panel is positioned;
    a flexible printed circuit electrically connecting electrodes of the display panel to the driving circuit;
    a driver integrated circuit connected through the flexible printed circuit to the display panel, the driver integrated circuit selectively providing a voltage to the electrodes of the display panel in accordance with signals controlled by the driving circuit,
    a pressing plate adapted to press the driver integrated circuit to the chassis base; and
    at least one connecting member for fixing the pressing plate to the chassis base;
    wherein a first thermally conductive medium in liquid-phase or gel-phase is placed between the driver integrated circuit and the chassis base; and
    wherein a second thermally conductive medium in liquid phase or gel-phase is placed between the pressing plate and the driver integrated circuit.

2. The display apparatus of claim 1, wherein the driver integrated circuit is adapted to fit in a tape carrier package and is connected to the flexible printed circuit.

3. The display apparatus of claim 1, wherein a high thermal conduction member is attached to the chassis base facing the driver integrated circuit, and the first thermally conductive medium in liquid-phase is placed between the driver integrated circuit and the high thermal conduction member.

4. The display apparatus of claim 1, wherein a high thermal conduction member is attached to the chassis base facing the driver integrated circuit, and the first thermally conductive medium in gel-phase is placed between the driver integrated circuit and the high thermal conduction member.

5. The display apparatus of claim 3, wherein the high thermal conduction member is made of a material selected from the group consisting of aluminum, copper and steel.

6. The display apparatus of claim 1, wherein the first thermally conductive medium in liquid-phase placed between the driver integrated circuit and the chassis base is a material selected from a group consisting of silicone oil, thermal grease, and a phase change material.

7. The display apparatus of claim 1 wherein the display panel is a plasma display panel.

8. The display apparatus of claim 1, wherein the pressing plate is formed into a single body having a first plane facing the driver integrated circuit and a second plane supporting the flexible printed circuit, the first plane placed parallel to the chassis base, the second plane extending from the outer edge of the first plane to the outer side of the edge of the display panel.

9. The display apparatus of claim 1, wherein the pressing plate is made of a material selected from a group consisting of aluminum, copper, and steel.

10. The display apparatus of claim 1, wherein the pressing plate is fixed to the chassis base by connecting members.

* * * * *